United States Patent [19]

Butler

[11] 3,933,219

[45] Jan. 20, 1976

[54] SPEAKER SYSTEM

[75] Inventor: John L. Butler, Marshfield, Mass.

[73] Assignee: Ambient, Inc., N. Marshfield, Mass.

[22] Filed: Apr. 8, 1974

[21] Appl. No.: 458,843

[52] U.S. Cl. .................. 181/144; 181/153; 181/147

[51] Int. Cl.² .......................................... H05K 5/00

[58] Field of Search ............................ 181/144–154; 179/1 GA, 1 E

[56] References Cited

UNITED STATES PATENTS

| | | | |
|---|---|---|---|
| 2,602,860 | 7/1952 | Doubt | 181/147 |
| 2,710,662 | 6/1955 | Camras | 181/145 |
| 3,131,783 | 5/1964 | Mares | 181/145 |
| 3,582,553 | 6/1971 | Bose | 181/147 |
| 3,627,948 | 12/1971 | Nichols | 181/147 |
| 3,670,842 | 6/1972 | Ekdahl et al | 181/147 |

*Primary Examiner*—Stephen J. Tomsky
*Attorney, Agent, or Firm*—Wolf, Greenfield & Sacks

[57] ABSTRACT

The system provides improved bass response and stereo effect with the use of a plurality of speakers that are preferably disposed in a unitary cabinet. If two woofer speakers are employed they are disposed at an angle to each other and are disposed relatively close to each other to provide mutual coupling and improved bass response. Also, the speakers are spaced from a rear wall of the listening room so as to permit the coupling and also to enhance the spacial response by sound refelection from not only the rear wall but also the side walls thereby also providing improved sound realism through increased reverberation. Quadraphonic operation is also readily provided with the use of two cabinets.

9 Claims, 5 Drawing Figures

SPEAKER SYSTEM

FIELD OF THE INVENTION

The present invention relates to a loudspeaker system that is preferably housed in a unitary cabinet. This system may include one type of speaker or may be a wide range system including woofers, tweeters and midrange speakers.

BACKGROUND OF THE INVENTION

Commonly, stereo systems have utilized two separate speaker cabinets or enclosures which may typically be spaced 5 to 10 feet apart and which are disposed for radiating more or less directly toward the listener. These types of systems have certain disadvantages associated therewith. For example, the sound appears to come from two distinct sources rather than being spread over an area or volume as would be the case at an actual life performance. Also, because of the relatively large separation between the cabinets or enclosures there is an empty area of sound between the two enclosures. Sometimes, this empty area is filled with an additional third speaker which, however, provides a rather cumbersome array of three separate enclosures.

Because the direct radiating system does not enhance the reverberation often lost in stereo recording, two additional speakers are presently being added to provide a quadraphonic effect.

This now means that there is an even more cumbersome system comprising at least four enclosures. With the direct two speaker system the reverberation is quite unreal as it is coming from only two distinct directions.

Another disadvantage with the direct radiating system employing two enclosures is that the speakers are separated far enough apart so that the bass enhancement is not appreciably provided. The bass enhancement is a function of the mutual coupling between the enclosures which in turn is a function of the distance therebetween. Furthermore, since in these prior art systems the speakers are mounted in the front of the enclosures there is no spacial enhancement from reflections from the rear wall of the listening room.

When the speaker enclosures are located in a room they have images which are at an equal distance on either side of the walls of the room. These images can contribute to the stereo effect. However, with the conventional system wherein the enclosures are separated they are generally close to the sidewalls of the room and consequently the images are also close to the sidewalls. In the present invention the speakers, being close together, provide images that are now far apart and can create a wider panaroma of sound. Alternatively, with the direct radiating speaker system the level of the sound from the images is small in comparison to the direct sound. However, if, with the direct radiating system, the two speakers are placed close together in the center of the room then there is the other disadvantage of not providing a full stereo effect.

The reflecting type system such as shown in U.S. Pat. No. 2,710,662 can overcome some of the disadvantages found in the two speaker direct radiating system. However, other reflecting type systems that exist also have disadvantages.

One system uses two speaker enclosures and directs the sound toward the rear wall of the room. Although the reflecting sound yields an improved stereo effect the center image is the result of the right channel mixing with the left channel resulting in image confusion in the center. Also, with the two separate enclosures little increase in the low frequency response through mutual coupling is realized. Moreover, this system requires two separate enclosures for stereo effect.

Another system of the prior art uses one enclosure with the right and left channels facing directly toward the right and left, respectively. In this system the two channels are connected out of phase to produce a null in the center and thus spread the images from one unitary enclosure. This system suffers in low frequency response because the two woofers are out of phase and have a mutual coupling that actually reduces the radiation rather than increasing the radiation. Moreover, because the radiation is maximum towards the right and left, the direction of the radiation from the images is not favorable for listening at removed distances from the enclosure.

Another system is of the type shown in U.S. Pat. No. 2,710,662. This system is a reflecting type that relies on no direct radiation; and thus the images from the side wall are not masked by the high level of the direct sound. However, this prior art system does not provide for both improved low frequency response and increased stereo separation. In fact, this prior art system teaches the reducing of the coupling between the right and left channels which is contrary to the teachings of the present invention.

Accordingly, one object of the present invention is to provide an improved loudspeaker system for use in a listening room and that provides improved stereo effect with a unitary enclosure. Another object of the present invention is to provide a loudspeaker system that is characterized by improved bass response and a spacial effect.

A further object of the present invention is to provide a loudspeaker system that can be embodied in many different arrangement and wherein two enclosures can be provided to produce quadraphonic effect.

SUMMARY OF THE INVENTION

To accomplish the foregoing and other objects of this invention there is provided a loudspeaker system for use in a listening room having an end wall and a pair of side walls. The system generall comprises a unitary speaker enclosure having a plurality of enclosing sides or panels including a pair of sides disposed at an angle other than a straight angle, to each other and also at an angle to the end wall of the listening room. Each of these pairs of sides carries at least one speaker. In a preferred embodiment for wide range effects both high and low frequency responsive speakers may be employed. The enclosure including the speakers is positioned close to but a small predetermined distance from the end wall to permit mutual coupling between the speakers and improved base response. The speakers are of course also disposed close together as they are in the same enclosure and are directed to radiate toward the end wall thereby also providing improved spacial response for the system.

In accordance with the present invention this system may also be designed with two enclosures for a quadraphonic effect. In addition, by a simple rewiring one enclosure can be used for the left channel and the other can be used for the right channel to provide a different stereo effect using two enclosures. This technique can also be extended to a four enclosure arrangement as disclosed hereinafter.

BRIEF DESCRIPTION OF THE DRAWINGS

Numerous other objects, features and advantages of the invention should now become apparent upon a reading of the following detailed description taken in conjunction with the accompanying drawings in which.

DETAILED DESCRIPTION

Figure 1:
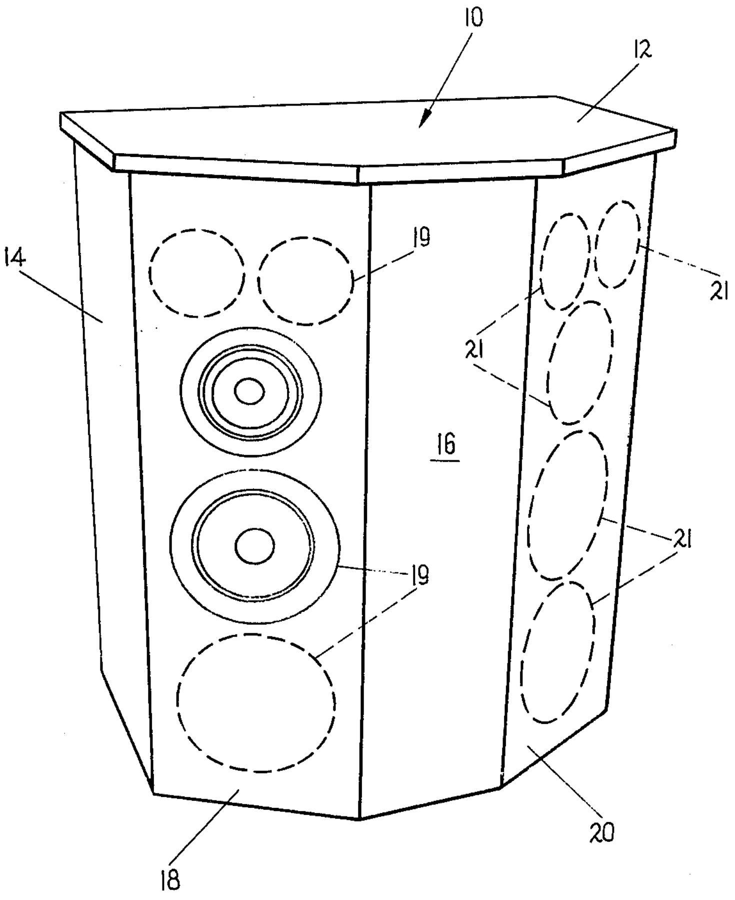
FIG. 1 is a perspective view of one embodiment of the enclosure or cabinet of the present invention showing the pair of walls or sides carrying the speakers.
Figure 2:
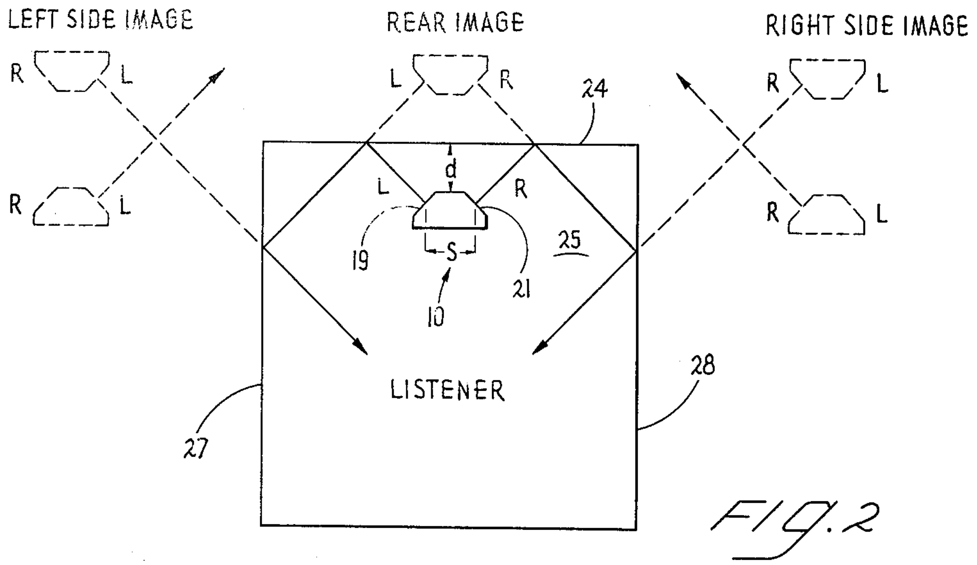
FIG. 2 is a diagramatic view showing the position of the enclosure of FIG. 1 relative to the walls of the room and also showing the images.

FIG. 1 is a perspective view of an enclosure constructed in accordance with the principals of the present invention. FIG. 2 depicts the position of the enclosure within a listening room. In FIG. 1 the enclosure 10 generally comprises a number of walls or panels including a top wall 12, side walls 14, a rear wall 16, and a pair of angularly disposed walls 18 and 20 for carrying the speakers. The enclosure may be constructed in any suitable manner with appropriate supporting structure not specifically shown in FIG. 1.

In FIG. 1 the wall 18 carries a plurality of speakers 19 and the wall 20 carries a similarly arranged plurality of speakers 21. With this type of an arrangement the two top speakers are tweeters the two bottom speakers are woofers and the middle speaker is a midrange speaker. These speakers are, per se, of conventional design and connect either to separate channels or as discussed hereinafter with reference to FIG. 4, to the same channel.

FIG. 2 diagramtically depicts the enclosure 10 and represents the walls 18 and 20 as having a single speaker 19 and 21, respectively. It is noted in FIG. 2 that the enclosure is spaced a predetermined distance from the end wall 24 of the listening room 25. This space *d* is preferably between approximately 9 and 16 inches. FIG. 2 also shows the left side, right side and rear images of the enclosure 10. In FIG. 2 the speakers 19 and 21 are for carrying respectively, the left and right channels.

The system of the present invention derives its improved base response through the increased radiation resistance by the close proximity of the right and left channel woofers. The distance between these two speakers is depicted in FIG. 2 as distance *s*. The area of the speakers need not be as large as with some prior art systems because with the greater loading more power output is obtained for a given piston velocity. Regarding the stereophonic effects if the two channels of a speaker system were housed in the same cabinet and faced directly toward the observer the sound would appear to come from only one central location. If the array were then connected out of phase to create a greater separation the low frequency response would be adversely effected. Instead, in the present invention the speakers are arranged at an angle to each other and to the rear wall but are not disposed too close to the rear wall of the listening room. In this way, the sound is reflected from the rear wall 24 and additionally from the side walls 27 and 28. This provides a greater separation and a greater distribution of the sound over the walls rather than localizing the sound from two discreet sources. For further increase in separation the system may be provided with a switch which puts the right and left channel midrange and tweeter speakers out of phase. This provides greater separation without reducing the bass response.

Referring now in particular to FIG. 2 it is noted that the sound is directed at an angle toward the rear wall with no direct radiation toward the listener. In this way, the reverberent effect is increased. Thus, with the arrangement shown in FIG. 2 there is provided increased low frequency response, greater image separation, and increased reverberation with only a single cabinet.

In FIG. 2 the separation between the right and left channel woofers is *s*. For two small sources the mutual ($R_{12}$) to self ($R_{11}$) radiation resistance may be expressed by the following equation:

$$\frac{R_{12}}{R_{11}} = \frac{\sin 2\pi s/\lambda}{2\pi s/\lambda}$$

Where $\lambda$ is the wavelength of sound, the $_1$ refers to the left channel and $_2$ refers to the right channel. The total real force on the left channel woofer is given by the following equation:

$$F_1 = F_{11} + F_{12} = R_{11} v_1 + R_{12} v_2$$

where $v_1$ and $v_2$ are of respective velocities. Thus the total radiation resistance on the left woofer is:

$$R_1 = \frac{F_1}{V_1} = R_{11} + \frac{V_2}{V_1} R_{12} = R_{11} + \frac{V_2}{V_1} R_{11} \frac{\sin 2\pi s/\lambda}{2\pi s/\lambda}$$

and for identical velocities:

$$R_1 = R_{11}\left(1 + \frac{\sin 2\pi s/\lambda}{2\pi s/\lambda}\right) = R_2$$

and for *s* small compared to $\lambda$ (low frequency range) it can be shown that $$R_1  2 R_{11}, R_2  2R_{22}$$

Since the power out is $|v_1|^2 R_1$ or $|v_2|^2 R_2$ the power out is doubled in the arrangement of the present invention in comparison with a two speaker stereo system where the dimension *s* is not so small. The doubling of the power out can be looked upon as a doubling of the efficiency.

Still referring to FIG. 2 and assuming that the distanct *d* is on the same order as the distance *s*, the power is again doubled by the image directly behind the rear wall. The distance *d* however, must be suitably large enough to allow the left and right channels to communicate. This distance is set by the highest frequency at which the communication is obtained. As indicated previously this dimension is typically on the order of 9 to 16 inches. If the dimension *d* is made too small only the lowest frequencies will be transmitted.

Regarding the stereo effect it can be seen in FIG. 2 that the sound from each channel is reflected off the rear wall and then off the respective side walls. This can also be considered as if the sound were coming from the images shown. These images yield a spread of right and left channel sound over the entire rear wall and some of the sidewalls. The distant images add to the sound in a way to increase the reverberation. This spread yields a panorama of sound without the unreal effect of two distinct sources as in the current two enclosure stereo systems.

In one embodiment four drivers are used inclined at an angle for wide dispersion and improved base response. The woofers have a compliant rubber surround for large linear displacements and the 1 inch dome tweeters have low transient distortion because of their light mass. The crossover frequency may be 1.8K Hertz and system resonance may be 50 Hertz.

The speakers can be driven with amplifiers with powers of from 15–30 watts per channel.

Figure 3:
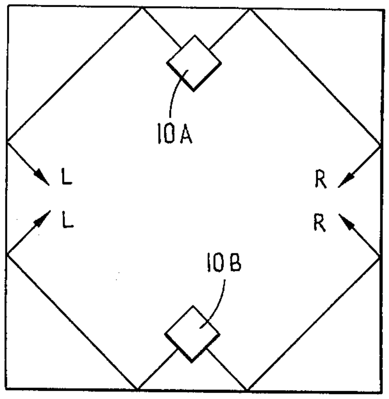
FIGS. 3, 4 and 5 show diagramtically different arrangements for the system of this invention using two or four enclosures.
Figure 4:
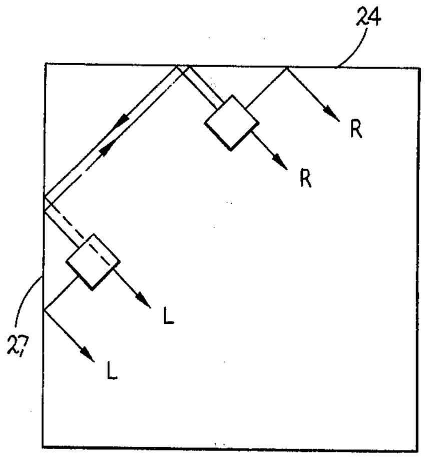
Figure 5:
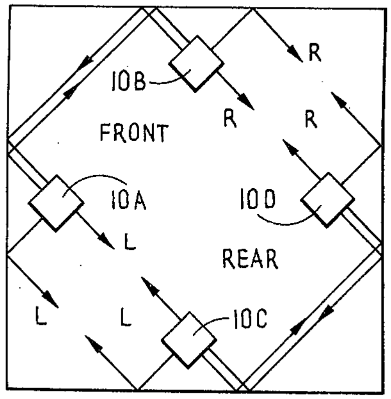

FIG. 3 shows another arrangement employing two cabinets 10A and 10B which are disposed at opposite ends the listening room. FIG. 4 shows another arrangement which utilizes two separate adjacent walls 24 and 27 rather than the single end wall 24. This is possible since each enclosure has right and left channel information. In this arrangement all of the left channel information appears to come from the enclosure on the left and all of the right channel information appears to come from the enclosure on the right. A conventional system mixes the left channel with the right and destroys the stereo effect. This is not the case with the embodiment shown in FIG. 4. The arrangement shown in FIG. 4 may be further extended to the arrangement shown in FIG. 5 employing four enclosures 10A, 10B, 10C and 10D which are essentially arranged to reflect sound from opposite corners and adjacent side walls.

Having described a limited number of embodiments of the present invention it should now be apparent that there are numberous other embodiments that are contemplated as following within the spirit and scope of the present invention. For example, there are various types of speakers that could be employed with this arrangement. Also, although the embodiment shown in FIG. 2 depicts the soundwaves emanating from the speaker as diverging, these speakers could also be arranged so that the soundwaves converge and effectively cross. Also, the enclosure may be constructed so that the walls 18 and 20 are directly joined with the enclosure having a square shape.

What is claimed is:

1. A speaker system for use in a listening room having means defining a plurality of reflective surfaces including an end wall, said system comprising a unitary dual channel speaker enclosure having a plurality of enclosing walls including a pair of walls disposed at an angle, other than a straight angle, to each other and also at an acute angle to the end wall of the room, and a pair of speaker arrays each including a low audio frequency speaker and an upper audio frequency speaker, each array carried, respectively, by each wall of the pair of walls and the speakers of each array being operated from different stereo channels to provide left and right channel signals to respective arrays thereby providing stereo effect in a unitary enclosure, each said low frequency speaker operating over a low frequency range having an upper frequency limit, said enclosure being positioned a predetermined distanced from the end wall to permit mutual coupling between the low audio frequency speakers wherein the distance $d$ is less than or equal to $\lambda/4$ wherein $\lambda$ is the wavelength of sound corresponding to the upper frequency limit of the low frequency speakers, said low frequency speakers being disposed apart a distance $s$ to provide mutual radiation resistance at bass frequencies, and radiating toward the end wall, wherein the distance $s$ is less than or equal to $\lambda/2$ where $\lambda$ is the wavelength of sound corresponding to the upper frequency limit of the low frequency speakers.

2. The system of claim 1 including a pair of enclosures disposed at opposite ends of the room to provide a quadraphonic effect.

3. The system of claim 1 including a pair of enclosures disposed at one corner of the room, one on either side of the corner.

4. The system of claim 1 including two pairs of enclosures disposed at opposite corners of the room.

5. A system as set forth in claim 1 wherein said enclosure is constructed to provide an unobstructed internal path between the speakers of each wall.

6. A system as set forth in claim 1 wherein the distance ($s$) is made small in comparison to the wavelength to be coupled so that the mutual radiation resistance approaches the magnitude of the self radiation resistance of one of the low frequency speakers.

7. A system as set forth in claim 6 wherein the ratio of the mutual radiation resistance to the self radiation resistance is approximated by the following equation:

$$\frac{R_{12}}{R_{11}} = \frac{\sin 2\pi s/\lambda}{2\pi s/\lambda}$$

where $R_{12}$ is the mutual radiation resistance between the two speaker arrays and $R_{11}$ is the self radiation resistance of one of the speaker arrays.

8. A system as set forth in claim 7 wherein $s$ is made small so that the mutual radiation resistance ($R_{12}$) is approximately equal to the self radiation resistance ($R_{11}$).

9. A system as set forth in claim 8 wherein the total radiation resistance is about twice either the self or mutual radiation resistance.

* * * * *

UNITED STATES PATENT OFFICE
CERTIFICATE OF CORRECTION

Patent No. 3,933,219 Dated January 20, 1976

Inventor(s) John L. Butler

It is certified that error appears in the above-identified patent and that said Letters Patent are hereby corrected as shown below:

On the Cover Sheet, Item [73] should be deleted.

Column 3, line 34 delete "as discussed".

Column 3, line 35 change "hereinafter with reference to FIG. 4," to -- connect --.

Column 3, line 48 change "base" to -- bass --.

In column 4, lines 31-33 please make a change in the equation changing "$V_1$" to -- $\nu_1$ --.

Column 4, line 42 change in two places "**" to -- ≃ --.

Column 4, lines 49 and 50 change "distanct" to -- distance --.

Signed and Sealed this

*twentieth* Day of *April 1976*

[SEAL]

*Attest:*

RUTH C. MASON
*Attesting Officer*

C. MARSHALL DANN
*Commissioner of Patents and Trademarks*